US011214172B2

(12) United States Patent
Althaus et al.

(10) Patent No.: US 11,214,172 B2
(45) Date of Patent: Jan. 4, 2022

(54) CAPACITIVE OCCUPANT DETECTION SYSTEM WITH IMPROVED ISOFIX DISCRIMINATION

(71) Applicant: IEE INTERNATIONAL ELECTRONICS & ENGINEERING S.A., Echternach (LU)

(72) Inventors: Frank Althaus, Saarbrücken (DE); Erik Holzapfel, Prüm (DE); Arnaud Meurens, Aubange (BE); Miguel Ribeiro, Niederkorn (LU); Guenter Wagner, Kanzem (DE)

(73) Assignee: IEE INTERNATIONAL ELECTRONICS & ENGINEEERING S.A., Echternach (LU)

( * ) Notice: Subject to any disclaimer, the term of this patent is extended or adjusted under 35 U.S.C. 154(b) by 216 days.

(21) Appl. No.: 16/622,460

(22) PCT Filed: Jun. 14, 2018

(86) PCT No.: PCT/EP2018/065743
§ 371 (c)(1),
(2) Date: Dec. 13, 2019

(87) PCT Pub. No.: WO2018/229172
PCT Pub. Date: Dec. 20, 2018

(65) Prior Publication Data
US 2021/0146799 A1 May 20, 2021

(30) Foreign Application Priority Data

Jun. 15, 2017 (LU) ....................................... 100 317

(51) Int. Cl.
*G01R 27/26* (2006.01)
*B60N 2/00* (2006.01)
(Continued)

(52) U.S. Cl.
CPC ............. *B60N 2/002* (2013.01); *G01N 27/22* (2013.01); *G01N 27/221* (2013.01);
(Continued)

(58) Field of Classification Search
CPC .... G01N 27/22; G01N 27/221; G01N 27/226; G01N 27/228; G01N 27/223;
(Continued)

(56) References Cited

U.S. PATENT DOCUMENTS 6,161,070 A  12/2000 Jinno et al.
6,392,542 B1  5/2002 Stanley
(Continued)

FOREIGN PATENT DOCUMENTS

JP  2009132224 A  6/2009
WO  WO9217344 A1  10/1992
(Continued)

OTHER PUBLICATIONS

International Search Report corresponding to International Application No. PCT/EP2018/065743, dated Sep. 17, 2018, 5 pages.
(Continued)

*Primary Examiner* — Raul J Rios Russo
(74) *Attorney, Agent, or Firm* — Reising Ethington P.C.

(57) ABSTRACT

A multi-electrode capacitive sensor is introduced to measure a spatial distribution of impedances to ground. The sensor can be used to identify the location of the highest impedance on the seating surface and can be a two-electrode sensor with a first electrode covering a central zone of a seat cushion and a second electrode with two galvanically connected electrode members, wherein each electrode member covers one side region of the seat cushion such that the first antenna electrode is arranged between the two electrode members of the second antenna electrode, or a two-electrode sensor with a left and right design. By measuring the difference of the
(Continued)

impedance to ground between the two zones the system can get a simplified picture of the impedance distribution on the seating surface. This information can be used to distinguish between grounded structures such as (ISOFIX) child restraint systems and human occupants.

9 Claims, 3 Drawing Sheets

(51) Int. Cl.
　　　G01V 3/38　　　(2006.01)
　　　G01N 27/22　　　(2006.01)
　　　B60R 21/015　　　(2006.01)
　　　G01R 17/16　　　(2006.01)

(52) U.S. Cl.
　　　CPC ......... *G01N 27/223* (2013.01); *G01N 27/226* (2013.01); *G01N 27/228* (2013.01); *G01V 3/38* (2013.01); *B60R 21/01532* (2014.10); *G01R 17/16* (2013.01); *G01R 27/26* (2013.01); *G01R 27/2605* (2013.01)

(58) Field of Classification Search
　　　CPC .... G01R 27/2605; G01R 27/26; G01R 17/16; B60N 2/002; G01V 3/38; B60R 21/01532; B60R 21/01556
　　　USPC ... 324/76.11–76.83, 459, 600, 649, 658, 663
　　　See application file for complete search history.

(56) References Cited

U.S. PATENT DOCUMENTS

| 6,703,845 | B2 | 3/2004 | Stanley et al. |
| 7,521,940 | B2 | 4/2009 | Koch et al. |
| 2006/0219460 | A1 | 10/2006 | Wanami |
| 2009/0295199 | A1 | 12/2009 | Kincaid et al. |
| 2011/0074447 | A1 | 3/2011 | Ootaka |
| 2018/0345894 | A1* | 12/2018 | Althaus ............ B60R 21/01532 |
| 2018/0370473 | A1* | 12/2018 | Lamesch ............ B60N 2/5685 |
| 2020/0198498 | A1* | 6/2020 | Althaus ............ B60R 21/01532 |

FOREIGN PATENT DOCUMENTS

| WO | WO9513204 A1 | 5/1995 |
| WO | WO2014122197 A1 | 8/2014 |
| WO | WO2017102386 A1 | 6/2017 |
| WO | WO2018229263 A1 | 12/2018 |

OTHER PUBLICATIONS

Written Opinion corresponding to International Application No. PCT/EP2018/065983, dated Sep. 17, 2018, 7 pages.
J. Smith et al., "Electric Field Sensing for Graphical Interfaces", IEEE Computer Graphics and Applications, vol. 18 No. 3, dated May/Jun. 1998, p. 54-60.

* cited by examiner

CAPACITIVE OCCUPANT DETECTION SYSTEM WITH IMPROVED ISOFIX DISCRIMINATION

TECHNICAL FIELD

The invention relates to a capacitive sensing device, a seat occupancy detection and classification system comprising such capacitive sensing device, a method of operating such capacitive seat occupancy detection and classification system and a software module for carrying out the method.

BACKGROUND OF THE INVENTION

Seat occupant detection and/or classification devices are nowadays widely used in vehicles, in particular in passenger cars, for providing a seat occupant signal for various appliances, for instance for the purpose of a seat belt reminder (SBR) system or an activation control for an auxiliary restraint system (ARS). Seat occupant detection and/or classification systems include seat occupant sensors that are known to exist in a number of variants, in particular based on capacitive sensing. An output signal of the seat occupant detection and/or classification system is usually transferred to an electronic control unit of the vehicle to serve, for instance, as a basis for a decision to deploy an air bag system to the vehicle seat.

A capacitive sensor, called by some electric field sensor or proximity sensor, designates a sensor, which generates a signal responsive to the influence of what is being sensed (a person, a part of a person's body, a pet, an object, etc.) upon an electric field. A capacitive sensor generally comprises at least one antenna electrode, to which is applied an oscillating electric signal and which thereupon emits an electric field into a region of space proximate to the antenna electrode, while the sensor is operating. The sensor comprises at least one sensing electrode—which could comprise the one or more antenna electrodes themselves—at which the influence of an object or living being on the electric field is detected.

The different capacitive sensing mechanisms are for instance explained in the technical paper entitled "*Electric Field Sensing for Graphical Interfaces*" by J. R. Smith et al., published in IEEE Computer Graphics and Applications, 18(3): 54-60, 1998. The paper describes the concept of electric field sensing as used for making non-contact three-dimensional position measurements, and more particularly for sensing the position of a human hand for purposes of providing three-dimensional positional inputs to a computer. Within the general concept of capacitive sensing, the author distinguishes between distinct mechanisms he refers to as "loading mode", "shunt mode", and "transmit mode" which correspond to various possible electric current pathways. In the "loading mode", an oscillating voltage signal is applied to a transmit electrode, which builds up an oscillating electric field to ground. The object to be sensed modifies the capacitance between the transmit electrode and ground. In the "shunt mode", which is alternatively referred to as "coupling mode", an oscillating voltage signal is applied to the transmit electrode, building up an electric field to a receive electrode, and the displacement current induced at the receive electrode is measured, whereby the displacement current may be modified by the body being sensed. In the "transmit mode", the transmit electrode is put in contact with the user's body, which then becomes a transmitter relative to a receiver, either by direct electrical connection or via capacitive coupling.

The capacitive coupling is generally determined by applying an alternating voltage signal to a capacitive antenna electrode and by measuring the current flowing from said antenna electrode either towards ground (in the loading mode) or into the second electrode (receiving electrode) in case of the coupling mode. This current is usually measured by means of a transimpedance amplifier, which is connected to the sensing electrode and which converts a current flowing into said sensing electrode into a voltage, which is proportional to the current flowing into the antenna electrode.

Some capacitive sensors are designed as sense-only capacitive sensors having a single sense electrode. Also, quite often capacitive sensors are used that comprise a sense electrode and a guard electrode that are proximally arranged and mutually insulated from each other. This technique of "guarding" is well known in the art and is frequently used for intentionally masking, and thus shaping, a sensitivity regime of a capacitive sensor. To this end, the guard electrode is kept at the same electric AC potential as the sense electrode. As a result, a space between the sense electrode and the guard electrode is free of an electric field, and the guard-sense capacitive sensor is insensitive in a direction between the sense electrode and the guard electrode.

Capacitive occupant sensing systems have been proposed in great variety, e.g. for controlling the deployment of one or more airbags, such as e.g. a driver airbag, a passenger airbag and/or a side airbag. U.S. Pat. No. 6,161,070, to Jinno et al., relates to a passenger detection system including a single antenna electrode mounted on a surface of a passenger seat in an automobile. An oscillator applies on oscillating voltage signal to the antenna electrode, whereby a minute electric field is produced around the antenna electrode. Jinno proposes detecting the presence or absence of a passenger in the seat based on the amplitude and the phase of the current flowing to the antenna electrode.

U.S. Pat. No. 6,392,542 to Stanley teaches an electric field sensor comprising an electrode mountable within a seat and operatively coupled to a sensing circuit, which applies to the electrode an oscillating or pulsed signal having a frequency "at most weakly responsive" to wetness of the seat. Stanley proposes to measure phase and amplitude of the current flowing to the electrode to detect an occupied or an empty seat and to compensate for seat wetness.

Others had the idea of using the heating element of a seat heater as an antenna electrode of a capacitive occupancy sensing system. International application WO 92/17344 A1 discloses an electrically heated vehicle seat with a conductor, which can be heated by the passage of electrical current, located in the seating surface, wherein the conductor also forms one electrode of a two-electrode seat occupancy sensor.

International application WO 95/13204 A1 discloses a similar system, in which the oscillation frequency of an oscillator connected to the heating element is measured to derive the occupancy state of the vehicle seat. More elaborate combinations of a seat heater and a capacitive sensor are disclosed, for instance, in U.S. Pat. No. 7,521,940 B2, US 2009/0295199 A1 and U.S. Pat. No. 6,703,845.

Capacitive antenna electrodes are generally designed in order to substantially cover the entire seating surface of the vehicle seat. This ensures that a passenger may be reliably detected even if the passenger is sitting in an unnatural way on the seat, e.g. on the front-most position of the vehicle seat.

Patent application publication US 2011/0074447 A1 proposes a capacitive occupant sensor for detecting an occupant sitting on a seat cushion of a seat of a vehicle that can discriminate between a small adult and a large adult. The capacitive occupant sensor includes a capacitive sensor mat, a cushion member, and a floating electrode. The capacitive sensor mat is disposed in the seat cushion and has a surface. The cushion member is disposed on the surface of the capacitive sensor mat. The floating electrode is disposed on an opposite side of the cushion member from the surface of the capacitive sensor mat. A projected area of the floating electrode with respect to the surface is smaller than the surface. The floating electrode is in an electrically-floating state with respect to the capacitive sensor mat. The occupant is detected based on an occupant capacitance between the capacitive sensor mat and the occupant and a floating capacitance between the capacitive sensor mat and the floating electrode. By using the capacitive occupant sensor, a small adult and a large adult can be discriminated based on the occupant capacitance and the floating capacitance.

Patent application publication US 2006/0219460 A1 proposes a passenger detection system for a person on a seat of a vehicle that includes a first, long range capacitance sensor for measuring a long range capacitance between a seating portion of the seat and a body of the vehicle, and a second, short range capacitance sensor for measuring a short range capacitance in the seat. The passenger detection system further includes a detection unit for detecting a passenger on the seat based on the measured long range capacitance and the measured short range capacitance. The passenger detection system can detect a state (e.g. a degree indicating how far the seat gets wet, humidity) of the seat by means of the second capacitance sensor. The passenger detection system can thereby detect a presence/an absence of a passenger on the seat or a physical size of the passenger. Thus, the passenger detection system can detect with a high accuracy the passenger of the seat based on the first capacitance in the state of the seat, even if the state changes.

The capacitive sensing system should be able to distinguish an empty seat or a seat equipped with a child restraint system (CRS), from a person directly sitting on the seat.

A reliable capability of distinguishing between potential seat occupant classes is essential for fulfilling high safety requirements. Compared to vehicle seat classification systems conducting mechanical load-based resistive measurements that are also known in the art, a capacitive measurement has the advantages of a simpler wiring and a stable and reproducible measurement over an entire temperature range as specified in common vehicle requirements.

A seat occupant detection and classification system, in particular for detecting and classifying a seat occupancy of a vehicle seat, that is based on capacitive sensing measures a physical quantity, for instance an electric current through a capacitive sensor member or a complex impedance or admittance of the capacitive sensor member, wherein the physical quantity is representative of an electric field between at least one sense electrode of the capacitive sensor member and a vehicle body.

The at least one sense electrode may be positioned on or inside the vehicle seat. A seat occupant or an object which is placed on the vehicle seat will modify the electric field of the sense electrode, resulting in a change of the measured physical quantity.

A problem concerning a capacitive sensing device, measuring a capacitive coupling between an antenna electrode and vehicle ground might occur as follows:

with a standard CRS, i.e. a non-grounded CRS installed on the seat by means of the seat belt, a seat equipped with a CRS is sensed as low capacity, whereas a person sitting directly on seat is sensed as high capacitance;

with a grounded CRS, i.e. with an ISOFIX CRS which is electrically connected to the vehicle ground, the system senses a high capacitance, which may create a misclassification.

In this way, vehicle seat occupant classification systems based on capacitive sensing are subject to being misled in the case of vehicle-grounded objects being placed on a vehicle seat, for instance an ISOFIX CRS, that in an installed state is grounded by mechanically connecting the CRS to anchorages that are fixedly attached to the vehicle body. ISOFIX child restraint systems are equipped with metallic clips that are configured for quick fixation at the anchorages. The metallic clips are part of a metal frame arranged inside the CRS. This metal frame could come close to the antenna electrode within a few millimeters. Depending on the proximity of the grounded CRS metal frame to the at least one antenna electrode of the capacitive sensor member, the sensed physical quantity might be large enough to cause the vehicle seat occupant classification system to classify a CRS electrically connected to vehicle ground as a "person sitting directly on seat".

In such cases, an ability of the vehicle seat occupant classification system to correctly classify a seat occupant might be affected. In the same way, any object that is connected to vehicle ground may lead to a misclassification by the vehicle seat occupant classification system due to a relatively small distance between the capacitive sensor member and the grounded object.

SUMMARY

It is therefore an object of the present invention to provide a seat occupant classification system with high functional robustness, in particular a vehicle seat occupant classification system, that enables a correct occupant classification even in the presence of conductive structures with coupling to ground, i.e. a CRS that is being installed with ISOFIX system and that is electrically connected to vehicle ground.

In one aspect of the present invention, the object is achieved by a capacitive sensing device for a seat occupancy detection and classification system. The capacitive sensing device includes a capacitive sensor, an impedance measurement circuit and a signal processing unit.

The capacitive sensor includes a plurality of electrically conductive antenna electrodes that are mutually galvanically separate from each other. The term "galvanically separate", as used in this application, shall particularly be understood to not conduct an electric direct current (DC) between galvanically separate objects.

The plurality of electrically conductive antenna electrodes comprises at least a first antenna electrode and at least a second antenna electrode that are arranged to mainly cover distinct portions of a seat cushion. The first antenna electrode is arranged to mainly cover a central portion of the seat cushion. The second antenna electrode comprises two electrode members that are galvanically connected to each other. Each electrode member covers one side region of the seat cushion such that the first antenna electrode is arranged between the two electrode members of the second antenna electrode.

The impedance measurement circuit comprises a signal voltage source that is configured for providing, with reference to a ground potential, a periodic electrical measurement signal at an output port, and at least one sense current measurement means that is configured to measure complex sense currents with reference to a reference voltage.

The impedance measurement circuit is electrically connected to the capacitive sensor such that each antenna electrode of the plurality of antenna electrodes is electrically connectable to the output port for receiving the electrical measurement signal.

A complex sense current is being generated by the provided periodic measurement signal in each antenna electrode of the plurality of antenna electrodes when it is connected to the signal voltage source output port (in the following also briefly referred to as "connected antenna electrode").

The phrases "electrically connectable" and "electrically connected", as used in this application, shall be understood to encompass galvanic electrical connections as well as electrical connections established by capacitive and/or inductive electromagnetic coupling. The phrases "configured to" and "configured for", as used in this application, shall in particular be understood as being specifically programmed, laid out, furnished or arranged.

The signal processing unit is configured to determine, with reference to the ground potential, a complex impedance of a connected antenna electrode from a measured complex sense current through the connected antenna electrode, and to provide output signals that are representative of the determined complex impedances. In the following, an impedance with reference to the ground potential may briefly be referred to as an "impedance to ground".

Embodiments of the invention described below exploit the fact that the same measured complex impedance to ground can be generated by objects having characteristic different spatial distributions of the complex impedance to ground that can be used for object classification. In this way, occurrence of measurement conditions with ambiguities regarding classifying seat occupancies can be prevented, and a capacitive sensing device with improved robustness with regard to detecting seat occupancies, particularly in the presence of grounded objects, such as child restraint systems, can be provided.

Instead of determining complex impedances from measured currents, the signal processing unit may be configured to determine complex admittances from measured currents without departing from the invention, as the real parts and the imaginary parts of a complex impedance and its corresponding complex admittance are interrelated by a one-to-one correspondence, as will readily be acknowledged by those skilled in the art.

In particular, the capacitive sensing device may be used for a vehicle seat occupancy detection and classification system. The term "vehicle", as used in this application, shall particularly be understood to encompass passenger cars, trucks and buses.

It is noted herewith that the terms "first" and "second" are used in this application for distinction purposes only, and are not meant to indicate or anticipate a sequence or a priority in any way.

The first antenna electrode and the second antenna electrode can as well be arranged in a juxtaposed manner such that each antenna electrode covers one side region of the seat cushion and an adjacent portion of the center region of the seat cushion.

Preferably, the capacitive sensor is operated in loading mode as described in the above-mentioned article *Electric field sensing for graphical interfaces* by J. Smith et al., which shall hereby be incorporated by reference in its entirety with effect for the jurisdictions permitting incorporation by reference. In general, it is also contemplated to operate the capacitive sensor in transmit mode or in shunt mode in some embodiments or in some modes of operation.

In one aspect of the present invention, the object is achieved by a seat occupancy detection and classification system, in particular a vehicle seat occupancy detection and classification system, including a capacitive sensing device as disclosed herein, wherein the capacitive sensor is electrically connected to the impedance measurement circuit such that an individual complex sense current through every antenna electrode of the plurality of antenna electrodes is measurable by the impedance measurement circuit.

The seat occupancy detection and classification system further comprises a control and evaluation unit that is configured:

to receive the output signals provided by the signal processing unit, to calculate a value representing a relationship between the complex impedances to ground determined for at least two distinct antenna electrodes of the plurality of antenna electrodes, to compare the value representing a relationship between the complex impedances to ground to at least one predetermined threshold value, and, based on the result of the comparing, to determine a seat occupancy class.

The value representing a relationship between the complex impedances to ground may be representative of any parameter or relation between the different zones to be considered. The calculated value may e.g. be at least one of a difference of the complex impedances to ground determined for at least two distinct antenna electrodes of the plurality of antenna electrodes, a ratio between the complex impedances, a normalized ratio, a normalized difference, . . . . In this way, a seat occupancy detection and classification system with improved robustness with regard to detecting and classifying seat occupancies, particularly in the presence of grounded objects or structures such as child restraint systems, can be provided.

In some embodiments, the capacitive sensing device of the seat occupancy detection and classification system is configured to connect any antenna electrode of the plurality of antenna electrodes to the signal voltage source output port one at a time, and the seat occupancy detection and classification system is configured to control the capacitive sensing device to periodically establish an electrical connection between an antenna electrode of the plurality of antenna electrodes and the signal voltage source output port for a predetermined time period and, after the time period has elapsed, to open the established electrical connection and to establish an electrical connection between another antenna electrode of the plurality of antenna electrodes and the signal voltage source output port. In this way, differences of the complex impedances determined for two distinct antenna electrodes of the plurality of antenna electrodes can be measured in a reliable and flexible manner. When a suitable predetermined time period is selected, a quasi-continuous operation of the seat occupancy detection and classification system can be accomplished with virtually no restriction to operational availability.

The skilled person will appreciate, that the connection of the antenna electrodes to the signal voltage source output port one at a time may be achieved by any suitable switching means, such as e.g. a remote controlled switch member. It will further be appreciated that the establishment of the connection may be achieved indirectly or "logically" by supplying an appropriate reference signal to the reference input of a transimpedance amplifier used for determining the current flowing into the respective antenna electrode. The establishment of the required connections is preferably controlled by a microcontroller. Microcontrollers that are suitably equipped and include, for instance, a processor unit, a digital data memory unit, a microcontroller system clock, a multiplexer unit and analog-to-digital converters are nowadays readily available in many variations.

In another preferred embodiment of the capacitive seat occupancy detection and classification system, the control and evaluation unit is configured to generate a classification output signal that is indicative of the determined seat occupancy class. The classification output signal of the control and evaluation unit can beneficially be transferred to an electronic control unit of the vehicle to serve, for instance, as a basis for a decision to deploy an air bag system to the vehicle seat.

In yet another aspect of the present invention, the object is achieved by a method of operating one of the disclosed capacitive seat occupancy detection and classification systems.

The method includes steps of:
providing the periodic electrical measurement signal to a first antenna electrode of the plurality of electrically conductive antenna electrodes,
determining a complex impedance to ground of the first antenna electrode from a complex sense current that is being generated in the first antenna electrode in response to the provided periodic electrical measurement signal,
providing the periodic electrical measurement signal to a second antenna electrode of the plurality of electrically conductive antenna electrodes,
determining a complex impedance to ground of the second antenna electrode of the plurality of electrically conductive antenna electrodes from a complex sense current that is being generated in the second antenna electrode in response to the provided periodic electrical measurement signal,
calculating a value representing a relationship between the determined complex impedance to ground of the first antenna electrode and the determined complex impedance to ground of the second antenna electrode,
comparing the calculated value representing a relationship at least one predetermined threshold value for the calculated value representing a relationship between the determined complex impedance,
determining a seat occupancy class for the calculated value representing a relationship between the determined complex impedances to ground, depending on a relation between the calculated value representing a relationship and the at least one predetermined threshold value for the value representing a relationship.

As stated above, the value representing a relationship between the complex impedances to ground may be representative of any parameter or relation between the different zones to be considered. The calculated value may e.g. be at least one of a difference of the complex impedances to ground determined for at least two distinct antenna electrodes of the plurality of antenna electrodes, a ratio between the complex impedances, a normalized ratio, a normalized difference, . . . . Further the relation between the determined complex impedance and the at least one selected predetermined threshold value for complex impedance may be one out of "larger than", "lower than" or "equal to". The relation may also comprise a constant factor, such as for instance "larger than 1.2 times".

In some embodiments, the method steps may be carried out automatically and periodically.

In yet another aspect of the invention, a software module for controlling an automatic execution of steps of an embodiment of the method disclosed herein is provided.

The method steps to be conducted are converted into a program code of the software module, wherein the program code is implementable in a non-transitory computer-readable medium such as a digital data memory unit of the capacitive vehicle seat occupancy detection and classification system and is executable by a processor unit of the capacitive vehicle seat occupancy detection and classification system. Preferably, the digital data memory unit and/or processor unit may be a digital data memory unit and/or a processing unit of the control and evaluation unit of the capacitive vehicle seat occupancy detection and classification system. The processor unit may, alternatively or supplementary, be another processor unit that is especially assigned to execute at least some of the method steps.

The software module can enable a robust and reliable execution of the method and can allow for a fast modification of method steps.

In yet another aspect of the invention, a seat, in particular a vehicle seat, with an installed capacitive seat occupant detection and classification system as disclosed herein is provided. The seat comprises a seat cushion having at least one seat foam member and a seat base that is configured for receiving at least a portion of the seat cushion. The seat base and the seat cushion are provided for supporting a bottom of a seat occupant. The capacitive sensor is arranged at the seat cushion.

In this way, a seat, in particular a vehicle seat, with a robust and reliable seat occupancy detection and classification can be provided.

In a preferred embodiment of the seat, at least one antenna electrode out of the plurality of antenna electrodes is formed by an electrical seat heater member that is installed in the seat. This embodiment combines the advantage of a robust and reliable seat occupancy detection and classification with the benefit of hardware savings.

BRIEF DESCRIPTION OF THE DRAWINGS

Further details and advantages of the present invention will be apparent from the following detailed description of not limiting embodiments with reference to the attached drawing, wherein.

DESCRIPTION OF THE ILLUSTRATED EMBODIMENTS

Figure 1:
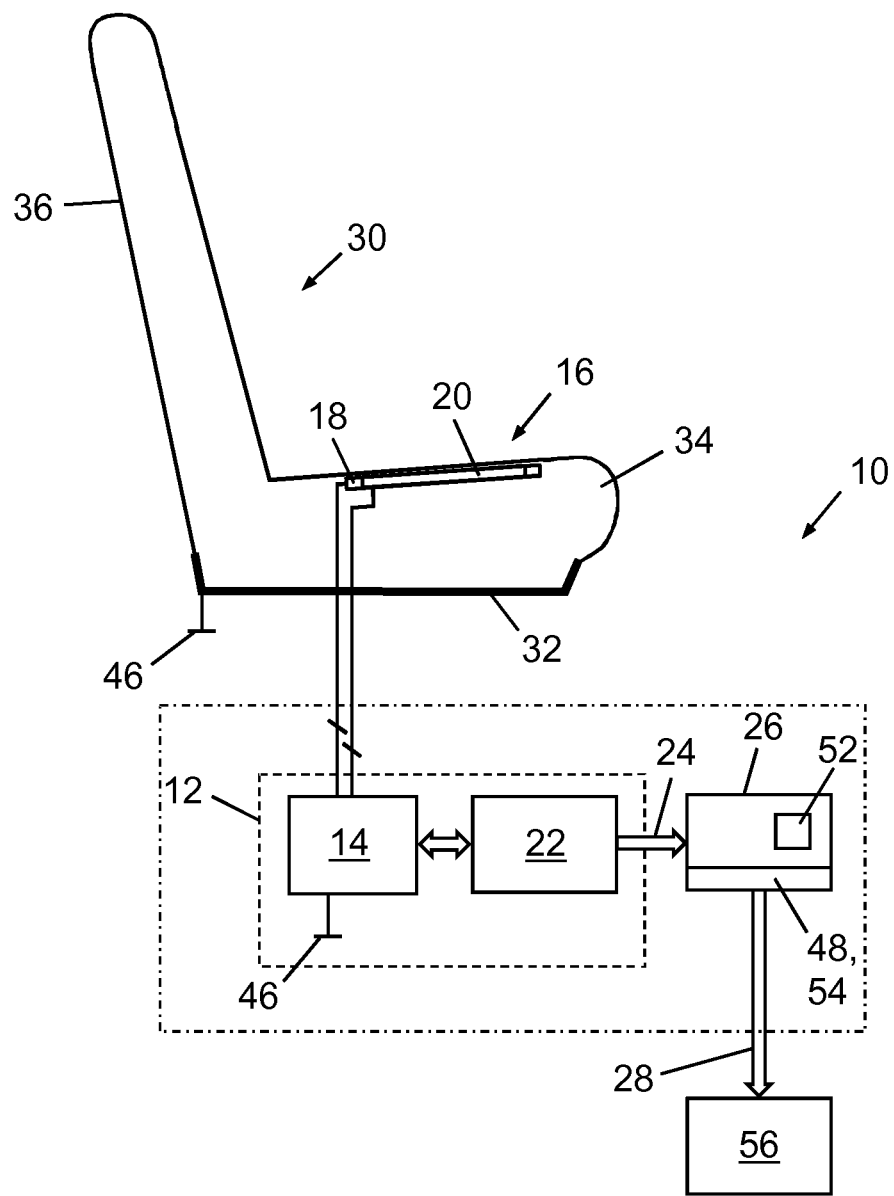
FIG. 1 schematically illustrates a vehicle seat in a side view with an installed embodiment of a seat occupancy detection and classification system in accordance with the invention.

FIG. 1 schematically shows a side view of seat 30 formed as a vehicle seat, comprising a capacitive seat occupancy detection and classification system 10 in accordance with an embodiment of the invention. The vehicle seat 30 is designed as a seat of a passenger car and includes a seat structure (not shown) by which it is erected on a passenger cabin floor of the passenger car, as is well known in the art.

The seat 30 further includes a seat base 32 supported by the seat structure and configured for receiving a seat cushion 34 for providing comfort to a seat occupant. The seat cushion 34 of the vehicle seat 30 comprises a seat foam member and a fabric cover, which has been omitted in FIG. 1. The seat base 32 and the seat cushion 34 are provided for supporting a bottom of the seat occupant. A backrest 36 of the seat 30 is provided as usual for supporting a back of the seat occupant.

Figure 2:
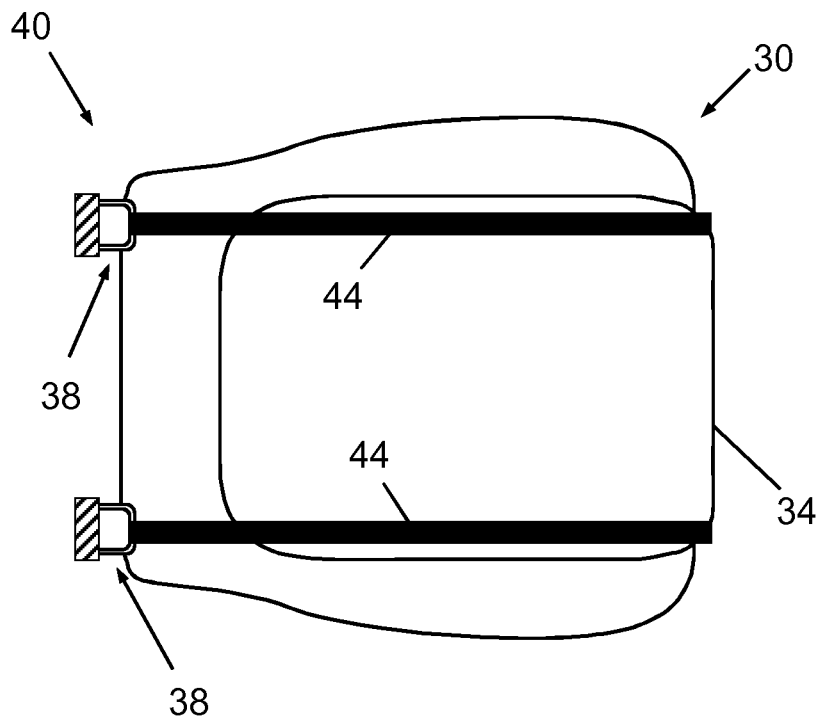
FIG. 2 schematically shows a seating surface (A surface) of the vehicle seat pursuant to FIG. 1 with an installed ISOFIX child restraint system in top view.

The vehicle is furnished with a pair of anchorages 38 (FIG. 2) that are fixedly attached at locations arranged between a rear edge of the seat cushion 34 and a bottom edge of the backrest 36. The anchorages 38 are designed as mounting brackets made from 6 mm diameter round bar steel and are compatible with the "ISOFIX" standard ISO 13216. The anchorages 38 are spaced from each other at a distance between 230 mm and 330 mm. The anchorages 38 are mechanically engaged with corresponding fixation members at ends of arms 44 of an ISOFIX child restraint system (CRS) 40.

If the ISOFIX CRS arms 44 are made from a small amount of metal, then there is usually also a small amount of metal used for the center area structure connecting the arms 44. If the CRS arms 44 are made from a large amount of metal, then a larger amount of metal is usually also used for the center area structure, as this is provides a stable mechanical connection of the center area structure to the ISOFIX anchorages 38.

Referring again to FIG. 1, the vehicle seat occupant detection and classification system 10 includes a capacitive sensing device 12 having a capacitive sensor 16, and a control and evaluation unit 26. The capacitive sensor 16 is located on the A-surface of the seat cushion 34, underneath the fabric cover. The capacitive sensing device 12 and the control and evaluation unit 26 are installed in the vehicle, remote from the vehicle seat 30. An output port of the control and evaluation unit 26 is connected to an airbag control unit 56. The capacitive sensing device 12 comprises an impedance measurement circuit 14 and a signal processing unit 22.

The impedance measurement circuit 14 includes a signal voltage source that is configured for providing, with reference to a ground potential 46, a periodic electrical measurement signal at an output port, and sense current measurement means that are configured to measure complex sense currents with reference to a reference voltage. The sense current measurement means may be formed as a transimpedance amplifier, which is connected to an antenna electrode and which converts a current flowing into the antenna electrode into a voltage, which is proportional to the current flowing into the antenna electrode. In principle, any other sense current measurement means could be employed that appears to be suitable to those skilled in the art.

Figure 3:
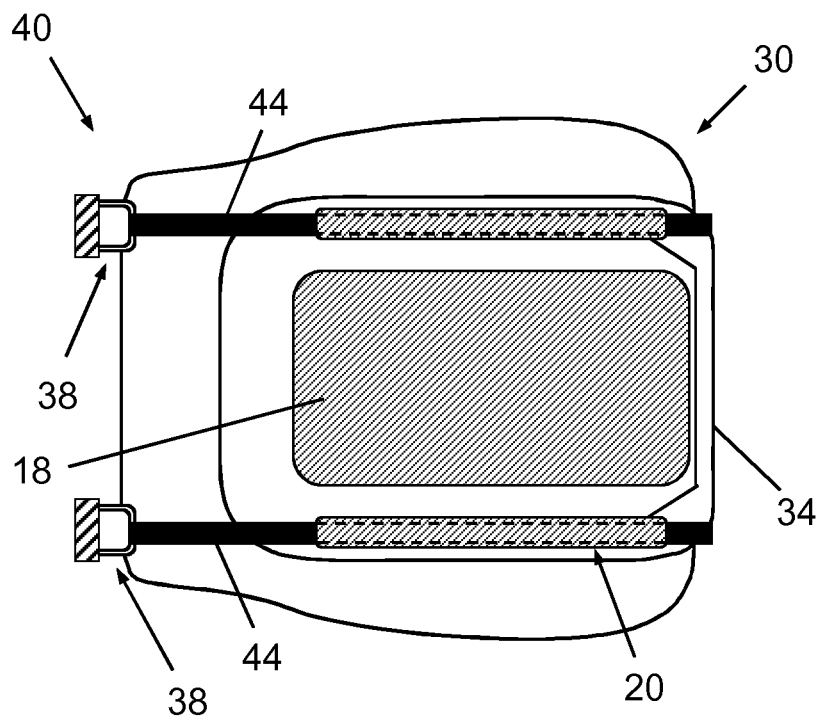
FIG. 3 schematically shows the vehicle seat pursuant to FIG. 1 and a plurality of electrically conductive antenna electrodes of the capacitive sensor seat occupancy detection and classification system pursuant to FIG. 1 in top view.

The capacitive sensor 16 comprises a plurality of electrically conductive antenna electrodes 18, 20 formed by a first electrically conductive antenna electrode 18 and a second electrically conductive antenna electrode 20 that are mainly horizontally arranged close to the A surface of the seat cushion 34 and are mutually galvanically separate from each other (FIG. 3).

The first antenna electrode 18 has a generally rectangular shape and covers a central portion of the seat cushion 34. The second antenna electrode 20 comprises two electrode members that are galvanically connected to each other. Each electrode member has a generally rectangular shape and covers one of the side regions of the seat cushion 34 such that the first antenna electrode 18 is arranged between the two electrode members of the second antenna electrode 20 in a spaced manner in a direction perpendicular to the normal seating direction.

In this specific embodiment, the first antenna electrode 18 and the second antenna electrode 20 are made from thin aluminum foil. Alternatively, they can be made from an aluminized plastic material such as polyethylene terephthalate (PET). The capacitive sensor 16 is electrically connected to the impedance measurement circuit 14 such that both the first antenna electrode 18 and the second antenna electrode 20 are electrically connected to the output port of the signal voltage source for receiving the electrical measurement signal.

In this specific embodiment both the first antenna electrode 18 and the second antenna electrode 20 are electrically connected to the output port of the signal voltage source. However, it is also contemplated that in other embodiments of the seat occupancy detection and classification system, the capacitive sensing device may comprise a remote controllable switch member that is configured to connect any antenna electrode of the plurality of antenna electrodes to the signal voltage source output port one at a time. In this case, the seat occupancy detection and classification system may further comprise a switch remote control unit for remotely controlling the remote controllable switch member.

In this specific embodiment, both the antenna electrodes 18, 20 are made from thin conductive foil, e.g. made of aluminum, or provided as printed conductive patches on a suitable, isolating carrier foil. In an alternative embodiment, only the second antenna electrode 20 is made from thin aluminum foil or printed on a suitable carrier material, while the first antenna electrode 20 is formed by an electrical seat heater member that is installed in the vehicle seat, as is well known in the art. The operating principle of the capacitive seat occupancy detection and classification system 10 disclosed herein as well applies to such an alternative embodiment.

The complex sense currents to be individually sensed by the current measurement means of the impedance measurement circuit 14 are being generated in each one of the first antenna electrode 18 and the second antenna electrode 20 of the capacitive sensor 16 by the provided periodic measurement signal, i.e. the regular operating mode of the capacitive sensor 16 is the loading mode.

The signal processing unit 22 (FIG. 1) is configured to determine complex impedances from the individually measured complex sense currents through the first antenna electrode 18 and the second antenna electrode 20, respectively, with reference to the ground potential 46. Moreover, the signal processing unit 22 is configured to provide output signals 24 that are representative of the determined complex impedances to ground.

The control and evaluation unit 26 is configured to receive the output signals 24 provided by the signal processing unit 22.

When the ISOFIX CRS 40 is installed at the vehicle seat 30 and the fixation members at the ends of the arms 44 are attached to the anchorages 38, the metallic center area structure comes close to the seat A-surface. Both the arms 44 and the center area structure are galvanically connected to ground potential 46 provided by the vehicle body. Metal parts of the CRS 40 that are arranged in close proximity to an antenna electrode of the plurality of antenna electrodes lead to a significant increase in a measured impedance to ground, making it difficult to distinguish between CRS 40 and human occupants. All ISOFIX CRS have a similar spatial distribution of metal parts. The most critical metal parts are the ISOFIX arms 44, which are common for ISOFIX CRS.

Figure 4:
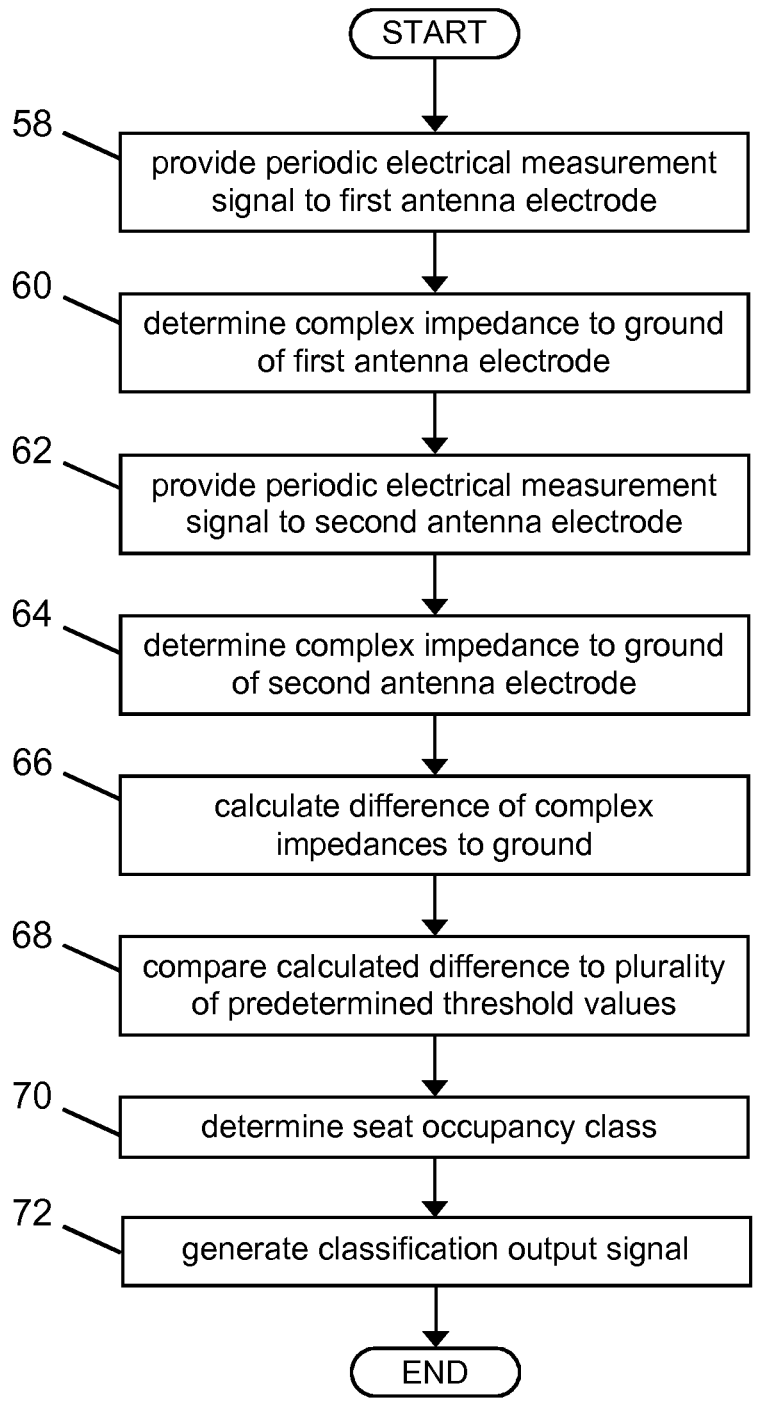
FIG. 4 is a flowchart of an embodiment of a method in accordance with the invention of operating the seat occupancy detection and classification system pursuant to FIG. 1.

In the following, an embodiment of a method of operating the capacitive seat occupancy detection and classification system 10 pursuant to FIG. 1 will be described. A flowchart of the method is provided in FIG. 4. In preparation of using the capacitive seat occupancy detection and classification system 10, it shall be understood that all involved units and devices are in an operational state and configured as illustrated in FIG. 1.

In order to be able to carry out the method, the control and evaluation unit 26 comprises a software module 54. The method steps to be conducted are converted into a program code of the software module 54. The program code is implemented in a non-transitory computer-readable medium such as a digital data memory unit 48 of the control and evaluation unit 26 and is executable by a processor unit 52 of the control and evaluation unit 26. Alternatively, the software module 54 may as well reside in and may be executable by a control unit of the vehicle, for instance by the airbag control unit 56, and established data communication means between the control and evaluation unit 26 and the airbag control unit 56 of the vehicle would be used for enabling mutual transfer of data.

In a first step 58 of the method, a periodic electrical measurement signal is provided to the first antenna electrode 18 of the capacitive sensor 16.

Then, in another step 60, a complex impedance to ground of the first antenna electrode 18 is determined by the signal processing unit 22 from a complex sense current that is being generated in the first antenna electrode 18 in response to the provided periodic electrical measurement signal and that is determined by the sense current measurement means with reference to a reference voltage.

In the next step 62, which, as described before, may be conducted simultaneously to step 58, a periodic electrical measurement signal is provided to the second antenna electrode 20 of the capacitive sensor 16.

In another step 64, a complex impedance to ground of the second antenna electrode 20 is determined by the signal processing unit 22 from a complex sense current that is being generated in the second antenna electrode 20 in response to the provided periodic electrical measurement signal and that is determined by the sense current measurement means with reference to a reference voltage.

In a next step 66, a difference of the determined complex impedance to ground of the first antenna electrode 18 and the determined complex impedance to ground of the second antenna electrode 20 is calculated.

The calculated difference of the determined complex impedances to ground is compared to a plurality of predetermined threshold values for the complex impedance to ground in another step 68.

The predetermined threshold values of the plurality of predetermined threshold values for the complex impedance to ground are based on empiric results and represent average values for various seat occupancy classes. In case of the multi-electrode sensor of FIG. 3 with a first inner electrode and a second outer electrode, the impedance measurement is linked to the amount of metal in this area. Human occupants will always give a high signal on the inner area whereas the ISOFIX CRSs will not. By measuring the difference of the signal from the inner area and the outer ISOFix arms area it's possible to get a robust separation between ISOFix with a high amount of metal on the seat and human occupants. The signal strength of the different configurations is given in the table below:

|  | ISOFIX CRS large amount of metal | ISOFIX CRS small amount of metal | Human $5^{th}$ percentile female | Human $50^{th}$ percentile male | Human $95^{th}$ percentile male |
| --- | --- | --- | --- | --- | --- |
| $1^{st}$ Antenna Electrode | Medium | Low | High | High | Very High |
| $2^{nd}$ Antenna Electrode | High | Medium | Low | Medium | High |
| Difference between $1^{st}$ and $2^{nd}$ | Negative High | Negative Medium | Positive High | Positive Medium | Positive Low |

The predetermined threshold values further comprise empirically determined ranges, wherein one of the ranges is assigned to each one of the average values for the various seat occupancy classes.

As shown by the table above, the difference of the signal strength caused by the difference of the complex impedances to ground of the first antenna electrode 18 and the second antenna electrode 20 enables to distinguish between the above-mentioned seat occupancy classes. The calculating difference of the determined complex impedances to ground provides an indication about the hip breadth of the human occupant sitting on the seat cushion, and thus can be used to classify different groups of humans such as child, 5th percentile female, 50th percentile male, etc.

The plurality of predetermined threshold values for the complex impedance to ground resides in the digital data memory unit 48 of the control and evaluation unit 26 to which the processor unit 52 has data access.

In the next step 70 then, the control and evaluation unit 26 determines a seat occupancy class for the calculated difference of the determined complex impedances to ground, depending on a relation between the calculated difference of determined complex impedance and the plurality of predetermined threshold values for the calculated difference of determined complex impedances. The relation is given by the calculated difference of the determined complex impedances to ground lying within the range of a specific seat occupancy class. In this case, the specific seat occupancy class is assigned to the calculated difference of the determined complex impedances to ground.

In a step 72, the control and evaluation unit 26 generates a classification output signal 28 that is indicative of the determined seat occupancy class. The classification output signal 28 is transferred to the airbag control unit 56 to serve as a basis for a decision to deploy an air bag system to the vehicle seat 30.

The control and evaluation unit 26 is configured to automatically and periodically carry out at least the above-described method steps 60 and 64 to 72.

While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

The invention claimed is:

1. A capacitive sensing device for a seat occupancy detection and classification system, including:
   a capacitive sensor that includes a plurality of electrically conductive antenna electrodes that are mutually galvanically separate from each other, the plurality of electrically conductive antenna electrodes comprising at least a first antenna electrode and at least a second antenna electrode that are arranged to mainly cover distinct portions of a seat cushion, wherein said first antenna electrode is arranged to mainly cover a central portion of the seat cushion and wherein said second antenna electrode comprises two electrode members, wherein said two electrode members are galvanically connected to each other and wherein each electrode member covers one side region of the seat cushion such that the first antenna electrode is arranged between the two electrode members of the second antenna electrode;
   an impedance measurement circuit, comprising:
      a signal voltage source that is configured for providing, with reference to a ground potential, a periodic electrical measurement signal at an output port, and
      at least one sense current measurement means that is configured to measure complex sense currents with reference to a reference voltage,
   wherein the impedance measurement circuit is electrically connected to said capacitive sensor such that each antenna electrode of the plurality of antenna electrodes is electrically connectable to the output port for receiving the electrical measurement signal,
   wherein a complex sense current is being generated by the provided periodic measurement signal in an antenna electrode of the plurality of antenna electrodes when it is connected to the signal voltage source output port, and
   a signal processing unit that is configured:
      to determine, with reference to the ground potential, a complex impedance of a connected antenna electrode from a measured complex sense current through the connected antenna electrode, and
      to provide output signals that are representative of the determined complex impedances.

2. A seat occupancy detection and classification system, in particular a vehicle seat occupancy detection and classification system, including:
   a capacitive sensing device as claimed in claim 1,
   wherein the capacitive sensor is electrically connected to the impedance measurement circuit such that an individual complex sense current through every antenna electrode of the plurality of antenna electrodes is measurable by said impedance measurement circuit, and
   a control and evaluation unit that is configured
      to receive the output signals provided by the signal processing unit,
      to calculate a value representing a relationship between the complex impedances determined for at least two distinct antenna electrodes of the plurality of antenna electrodes with reference to the reference voltage,
      to compare the value representing a relationship between the complex impedances to at least one predetermined threshold value, and, based on the result of the comparing, to determine a seat occupancy class.

3. The seat occupancy detection and classification system as claimed in claim 2, wherein the capacitive sensing device is configured to connect any antenna electrode of the plurality of antenna electrodes to the signal voltage source output port one at a time, and wherein the capacitive seat occupancy detection and classification system is configured to control the capacitive sensing device to periodically establish an electrical connection between an antenna electrode of the plurality of antenna electrodes and the signal voltage source output port for a predetermined time period and, after the time period has elapsed, to open the established electrical connection and to establish an electrical connection between another antenna electrode of the plurality of antenna electrodes and the signal voltage source output port.

4. The capacitive seat occupancy detection and classification system as claimed in claim 2, wherein the control and evaluation unit is configured to generate a classification output signal that is indicative of the determined seat occupancy class.

5. A method of operating the capacitive seat occupancy detection and classification system as claimed in claim 2, including steps of:
   providing the periodic electrical measurement signal to a first antenna electrode of the plurality of electrically conductive antenna electrodes,
   determining a complex impedance to ground of the first antenna electrode from a complex sense current that is being generated in the first antenna electrode in response to the provided periodic electrical measurement signal,
   providing the periodic electrical measurement signal to a second antenna electrode of the plurality of electrically conductive antenna electrodes,
   determining a complex impedance to ground of the second antenna electrode from a complex sense current that is being generated in the second antenna electrode in response to the provided periodic electrical measurement signal,
   calculating a value representing a relationship between the determined complex impedance to ground of the first antenna electrode and the determined complex impedance to ground of the second antenna electrode,
   comparing the calculated value representing the relationship to at least one predetermined threshold value for the calculated value representing the relationship between the determined complex impedance, and
   determining a seat occupancy class for the calculated value representing the relationship between the determined complex impedances to ground, depending on a relation between the calculated value representing the relationship between determined complex impedance and the at least one predetermined threshold value for the value representing the relationship.

6. A seat, in particular a vehicle seat, comprising:
   a seat cushion having at least one seat foam member,
   a seat base configured for receiving at least a portion of the seat cushion, the seat base and the seat cushion being provided for supporting a bottom of a seat occupant, and
   a seat occupant detection and classification system as claimed in claim 2, wherein the capacitive sensor is arranged at the seat cushion.

7. The seat as claimed in claim 6, wherein at least one antenna electrode of the plurality of antenna electrodes is formed by an electrical seat heater member that is installed in the seat.

8. A non-transitory computer-readable medium for carrying out the method as claimed in claim 5, wherein the method steps are stored on the computer-readable medium as a program code, wherein the computer-readable medium comprises a part of the capacitive seat occupancy detection and classification system or a separate control unit and the program code is executable by a processor unit of the capacitive seat occupancy detection and classification system or a separate control unit.

9. Use of the capacitive seat occupancy detection and classification system as claimed in claim 2 in a vehicle seat that includes:
- a seat structure for erecting the vehicle seat on a passenger cabin floor of the vehicle,
- a seat cushion having at least one seat foam member,
- a seat base supported by the seat structure and configured for receiving the seat cushion, the seat base and the seat cushion being provided for supporting a bottom of a seat occupant,
- wherein the capacitive sensor member is arranged at the seat cushion.

* * * * *